(12) United States Patent
Chantre et al.

(10) Patent No.: US 6,551,891 B1
(45) Date of Patent: Apr. 22, 2003

(54) PROCESS FOR FABRICATING A SELF-ALIGNED VERTICAL BIPOLAR TRANSISTOR

(75) Inventors: Alain Chantre, Seyssins (FR); Michel Marty, Varces (FR); Helene Baudry, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/668,428

(22) Filed: Sep. 22, 2000

(30) Foreign Application Priority Data

Sep. 23, 1999 (FR) .............................................. 99 11895

(51) Int. Cl.[7] .......................................... H01L 21/331
(52) U.S. Cl. ...................................... 438/343; 257/587
(58) Field of Search ................................ 257/565, 200, 257/587; 438/355, 354, 353, 348, 317, 318, 321, 343

(56) References Cited

U.S. PATENT DOCUMENTS

| | | | |
|---|---|---|---|
| 4,524,247 A | * 6/1985 | Lindenberger et al. | ..... 179/117 |
| 5,620,907 A | * 4/1997 | Jalali-Farahani et al. | ... 438/320 |
| 6,077,742 A | * 6/2000 | Chen et al. | .................. 438/255 |
| 6,130,136 A | * 10/2000 | Johnson et al. | ............. 438/365 |
| 6,143,582 A | * 11/2000 | Vu et al. | ....................... 438/30 |
| 6,184,556 B1 | * 2/2001 | Yamazaki et al. | .......... 257/354 |
| 6,215,190 B1 | * 4/2001 | Bruce et al. | ................. 257/774 |
| 6,316,815 B1 | * 11/2001 | Tseng | .......................... 257/510 |

FOREIGN PATENT DOCUMENTS

| | | | |
|---|---|---|---|
| EP | 0 035 126 A | | 9/1981 |
| JP | 406112517 A | * | 4/1994 |

OTHER PUBLICATIONS

Preliminary Search Report dated Jul. 18, 2000 with annex on French Application No. 99/1895.

* cited by examiner

Primary Examiner—Wael Fahmy, Jr.
Assistant Examiner—Dana Farahani
(74) Attorney, Agent, or Firm—Lisa K. Jorgenson; Jon A. Gibbons; Fleit, Kain, Gibbons, Gutman & Bongini P.L.

(57) ABSTRACT

The fabrication process comprises a phase of producing a base region having an extrinsic base and an intrinsic base, and a phase of producing an emitter region comprising an emitter block having a narrower lower part located in an emitter window provided above the intrinsic base. Production of the extrinsic base comprises implantation of dopants, carried out after the emitter window has been defined, on either side of and at a predetermined distance dp from the lateral boundaries of the emitter window, so as to be self-aligned with respect to this emitter window, and before the emitter block is formed.

22 Claims, 5 Drawing Sheets

PROCESS FOR FABRICATING A SELF-ALIGNED VERTICAL BIPOLAR TRANSISTOR

CROSS-REFERENCE TO RELATED APPLICATIONS

This application is based upon and claims priority from prior French Patent Application No. 9911895, filed Sep. 23, 1999, the entire disclosure of which is herein incorporated by reference.

BACKGROUND OF THE INVENTION

1. Field of the Invention

The present invention relates to vertical bipolar transistors, especially those intended to be integrated into high-frequency very-large-scale integrated technologies (VLSI), and in particular to the production of the extrinsic base and of the emitter window of these transistors.

2. Description of Related Art

In polysilicon-emitter bipolar technologies, the emitter region generally comprises an emitter block having a narrower lower part located in a window, called the "emitter window", provided above the intrinsic base of the transistor. The emitter block also has a wider upper part which extends beyond the emitter window and rests on an insulating layer (generally formed from two insulating sublayers) above the base region.

Implantation of the extrinsic base takes place on either side of the wider, upper part of the emitter.

Next, the emitter window and the upper part of the emitter block are defined, using two separate photolithography levels which require two photolithography masks.

A diffused dopant zone is located beneath the emitter window of the emitter. In order to avoid contact between the diffused dopant zone and the boundary of the implanted zone of the extrinsic base, it is necessary, when producing the emitter, to specify a minimum distance between the boundaries of the emitter window and the boundaries of the upper part of the emitter block. This distance takes into account many parameters, especially the extension of the implanted zones during thermal anneals, as well as tolerances in the fabrication process.

Moreover, since two photolithography masks, i.e. two photolithography levels, are used, it is also necessary when defining the distance to take into account the alignment tolerance between the two photolithography masks.

Furthermore, taking this alignment tolerance into account requires the distance between the boundaries of the emitter window and the boundaries of the upper part of the emitter block to be increased so as to avoid any risk of contact between the diffused dopant zone beneath the emitter and the extrinsic base region.

Accordingly, this leads to the area of the intrinsic collector located between the two implanted extrinsic base zones being intentionally increased, with the consequence that the base-collector capacitance is increased.

Continuing further, taking into account this alignment tolerance also leads to the distance between the emitter window and the extrinsic base zones being intentionally increased, with the consequence that the base access resistance is increased.

All this leads to several shortcoming. One shortcoming is the dispersion in the characteristics of the transistor. Another shortcoming is inhomogeneity in the characteristics of the transistors fabricated from the same wafer. Yet, another shortcoming leads to degradation of the high-frequency performance of these transistors, such as, for example, the value of the maximum oscillation frequency (power gain cutout frequency).

These short comings have a penalizing effect on all types of vertical bipolar transistors, and most particularly for those intended to be integrated into high-frequency very-large-scale integrated technologies (VLSI), and which in this regard have an epitaxially grown base with a silicon-germanium (SiGe) heterojunction.

Accordingly, a need exists to overcome the shortcomings of the prior art where the extrinsic base is self-aligned with respect to the polysilicon emitter block but is not self-aligned with respect to the emitter window since two photolithography masks have been used, with the result that there is an alignment tolerance.

SUMMARY OF THE INVENTION

One object of the invention is to propose a way of fabricating a vertical bipolar transistor whose extrinsic base is self-aligned with respect to the emitter window, something which is not the case in the prior art that has just been mentioned.

Briefly, in accordance with the invention a process for fabricating a bipolar transistor comprising a phase of producing a base region having an extrinsic base and an intrinsic base and a phase of producing an emitter region comprising an emitter block having a narrower lower part located in an emitter window provided above the intrinsic base.

According to a general characteristic of the invention, the production of the extrinsic base comprises the implantation of dopants, carried out after definition of the emitter window, on either side of and at a predetermined distance from the lateral boundaries of the emitter window, so as to be self-aligned with respect to this emitter window and before the emitter block is formed.

The self-alignment with respect to the emitter window of the implanted extrinsic base is obtained because the emitter window is defined using a single photolithography mask and because this extrinsic base implantation is carried out before the emitter block is formed. The invention is therefore distinguished from the prior art which provided self-alignment of the extrinsic base not with respect to the emitter window but with respect to the polysilicon emitter block, and in which prior art the implantation of the extrinsic base was furthermore carried out after the emitter block was formed.

The invention applies to any type of vertical bipolar transistor, whatever the type of base used, whether this is a conventional silicon base or else a base with a silicon-germanium heterojunction, and any the method of producing the base, whether by implantation or epitaxy, for example.

According to one method of implementing the invention, an oxide block is produced on an insulating layer formed above the intrinsic base (this insulating layer possibly being formed, for example, from two insulating sublayers made of two different dielectrics, for example silicon dioxide and silicon nitride). The oxide block has a narrower lower part extending into an orifice etched in the insulating layer, the dimensions of the etched orifice corresponding to those of the emitter window. The oxide block also has a wider upper part resting on the insulating layer, the lateral edges of the etched orifice in the insulating layer being self-aligned with the lateral edges of the upper part of the oxide block. The implantation of the extrinsic base is then carried out on either side of the upper part of the oxide block. Self-alignment with respect to the upper part of the oxide block, and consequently self-alignment with respect to the lateral edges of the etched orifice and therefore of the emitter window, is therefore self-aligned.

A process for fabricating a bipolar transistor comprising the steps of: producing a base region comprising an extrinsic base and an intrinsic base; producing an emitter region above the intrinsic base comprising an emitter block with a narrower lower part located in an emitter window, the emitter window produced with vertical lateral boundaries; and implanting dopants in the extrinsic base before the emitter block is formed and after the production of the emitter window, so that dopants are implanted on either side of and at a predetermined distance from the vertical lateral boundaries of the emitter window, so that the extrinsic base is self-aligned with respect to the emitter window.

The insulating layer preferably comprises a first sublayer formed from a first silicon oxide (for example $SiO_2$) above which is a second sublayer formed from a second dielectric (for example $Si_3N_4$). The spacers and the oxide block are formed from the first silicon oxide (for example $SiO_2$). The etching of the cavity in the sacrificial layer and the etching of the spacers are carried out so as to stop on the second insulating sublayer ($Si_3N_4$). The orifice, whose dimensions correspond to those of the emitter window, is then etched in the second insulating sublayer ($Si_3N_4$).

The sacrificial layer may be made of polysilicon, or else of silicon-germanium, thereby making it easier to remove the sacrificial layer.

The sacrificial layer is preferably removed by isotropic plasma etching, using a gas mixture consisting of hydrobromic acid (HBr) and oxygen, in a volume ratio of the order of 10, at a pressure greater than 15 mTorr. In this way, very good selectivity both with respect to the material of the oxide block and with respect to the silicon nitride is obtained.

According to one method of implementing the invention, production of the emitter comprises etching of the oxide block and of that part of the insulating layer which is located in the emitter window, formation of a polysilicon layer on the unetched parts of the insulating layer and on that part of the intrinsic base which is located in the emitter window, and etching of the polysilicon layer so as to form the emitter block.

The base may be a base with a silicon-germanium heterojunction and formation of the base region may comprise epitaxy of a stack of silicon-germanium layers.

Moreover, according to one method of implementing the invention, production of the emitter may comprise epitaxy, on the emitter window, of the upper surface of the base stack so as to obtain, at least above the window, an emitter region formed from monocrystalline silicon and directly in contact with the upper layer of the stack.

BRIEF DESCRIPTION OF THE DRAWINGS

Other features and advantages of the invention will be seen from the following detailed description made with reference to the appended drawings, of which.

Further advantages and characteristics of the invention will appear on examining the detailed description of an in no way limiting method of implementation and the appended drawings, in which.

DESCRIPTION OF THE EMBODIMENTS

Figure 1:
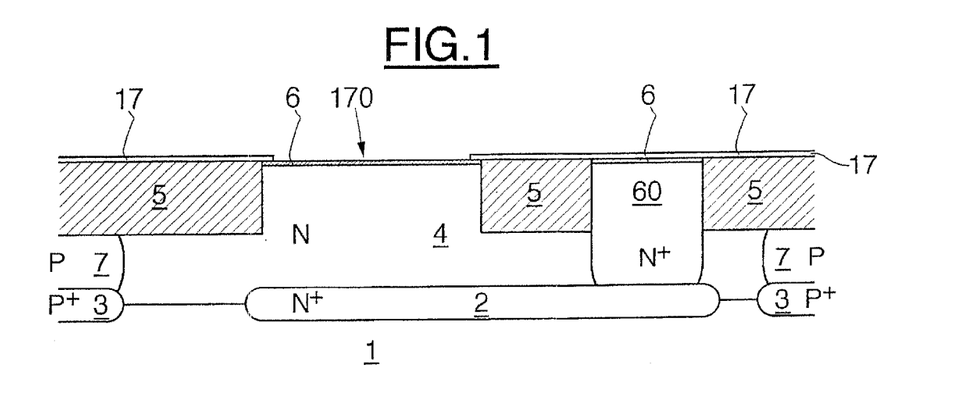
FIGS. 1 to 12 illustrate schematically one method of implementing the process according to the invention.

In FIG. 1, the reference number 1 denotes a silicon substrate, for example a p-type silicon substrate, on the surface of which an $n^+$-doped buried extrinsic collector layer 2 has been conventionally produced, in a known manner, by arsenic implantation.

Likewise, two $p^+$-doped buried layers 3 are conventionally produced, on either side of the extrinsic collector 2, by boron implantation.

Thick epitaxy is carried out, in a manner known per se, on the substrate 1 thus formed so as to produce a layer 4 of n-type monocrystalline silicon having a thickness typically of the order of 1 micron.

Next, a lateral isolating region 5 is produced in this layer 4, in a manner known per se, by either a localized oxidation process (or LOCOS) or a process of the "shallow trench" type.

A lateral isolating region 5 of the shallow-trench type has been shown in FIG. 1 for the sake of simplification.

Also produced conventionally, especially by phosphorus implantation, is an $n^+$-doped collector well 60 which makes contact with the buried layer 2.

Next, boron implantations are carried out so as to produce p-doped wells 7 under the lateral isolating region 5, allowing isolation with respect to the transistors adjacent to the bipolar transistor described here.

Next, a thermal oxide, typically silicon dioxide, is grown, conventionally, on the surface of the epitaxially grown monocrystallic intrinsic collector 4. This silicon dioxide growth is also carried out over the entire wafer, and especially over the collector well 60. This oxide also forms the gate oxide for the complementary insulated-gate field-effect transistors (CMOS transistors) produced together with the bipolar transistors on the same wafer (BiCMOS or bipolar CMOS technology).

Next, a layer 17 of polycrystalline silicon, having a thickness of the order of 500 Å, is deposited on the semiconductor block thus formed.

A window 70, called "base window" is then etched by plasma etching, stopping on the oxide layer 6.

If lateral isolation of the shallow-trench type is used, the two parts of the etched silicon layer 17 extend slightly on top of the intrinsic collector 4. If lateral isolation of the "LOCOS"type is used, the etching window 170 may be wider than the intrinsic collector 4.

Figure 2:
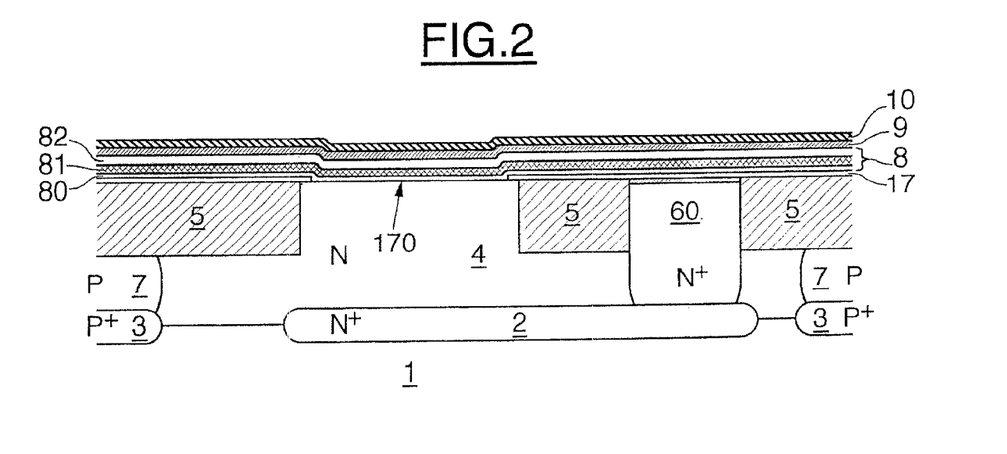

As shown in FIG. 2, the oxide layer 6 located above the connector undergoes chemical deoxidation. It should be noted here that one of the functions of the polycrystalline silicon layer 17 is that of protecting, during this chemical deoxidation, the rest of the wafer and especially the lateral isolation zones when these are produced by shallow trenches.

Next, after a desorption treatment of the base window with hydrogen at a temperature greater than 600° C., a stack 8 of three layers 80, 81 and 82 is grown epitaxially, within which layers the future base of the transistor will be produced. More specifically, a first layer 80, of undoped silicon, is grown epitaxially to a thickness of a few tens of nanometers. The second layer 81 formed from silicon-germanium is then growth epitaxially. It is in fact composed of a first sublayer of $Si_{1-x}Ge_x$ with x constant and ranging from 0.1 to 0.2, on which a second sublayer, also formed from an $Si_{1-x}Ge_x$ alloy (with x for example decreasing down to 0) and p-doped with boron, is deposited. The total thickness of the layer 81 is very small, typically from 20 to 100 nm.

A layer 82, having a thickness of a few tens of nanometers, of silicon, p-doped using boron, is then grown epitaxially on the second sublayer of the layer 81.

After this epitaxy, typically carried out at 700° C. in an ultra clean CVD deposition reactor, a stack of monocrystalline layers, on the intrinsic collector in the base window, and of polycrystalline layers above the polycrystalline silicon layers 17 is obtained. This multilayer stack must allow a base with a silicon-germanium heterojunction to be formed.

It should be noted here that the epitaxy for producing the base with a heterojunction is non-selective epitaxy.

However, the invention also applies to any type of base, whether made of silicon or silicon-germanium, and whatever its method of production, whether by selective or non-selective epitaxy, or for example by implantation directly in the collector.

It should also be noted here that the presence of the polycrystalline silicon layer 17 makes it possible to present, at the start of epitaxy, a surface essentially formed from silicon, thereby making it possible to achieve a substantially identical growth rate on the intrinsic collector and the polycrystalline silicon, resulting in better homogeneity in the thickness of the base.

Next, a first insulating sublayer 9, of silicon dioxide, having a thickness of the order of 200 Å is deposited on the layer 81.

A second insulating sublayer 10, of silicon nitride ($Si_3N_4$), having a thickness of the order of 300 Å is deposited on the silicon dioxide first sublayer 9.

The production of the emitter window and of the extrinsic base will now be described with reference more particularly to FIGS. 3 to 8.

For the purpose of simplification and for the sake of clarity, FIGS. 3 to 8 show only that part of the transistor which is located above the base window 170 provided above the intrinsic collector 4.

Figure 3:
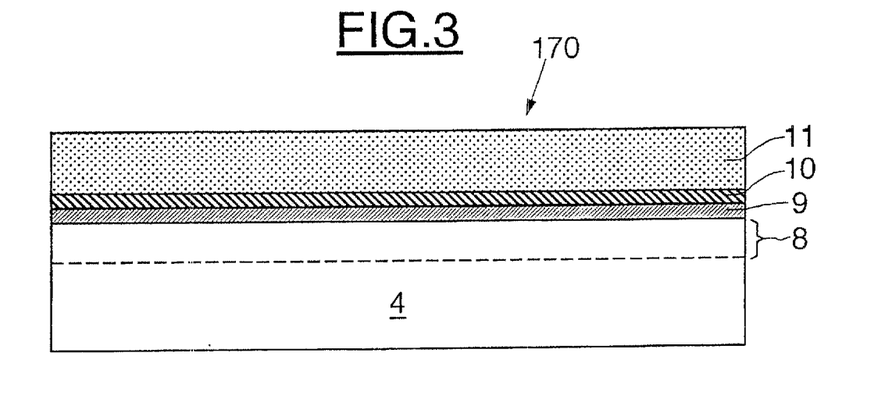

A so-called "sacrificial layer" 11, formed here from polysilicon and having, for example, a thickness of the order of 2000 Å, is deposited on the nitride sublayer 10.

A cavity 110 is then defined in the sacrificial layer 11 by conventional photolithography, using a photolithography mask. Next, the polysilicon is etched, stopping on the sublayer 10, so as to form the cavity 110 as shown in FIG. 4.

Figure 4:
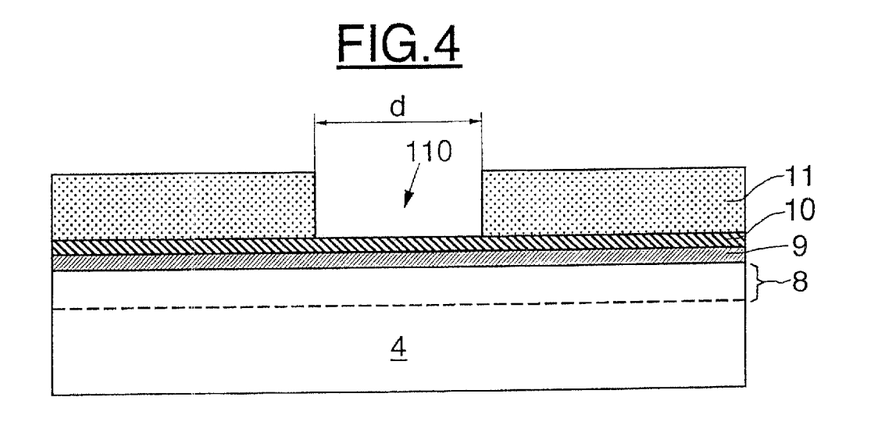

Next, a conformal coating of oxide, for example silicon dioxide $SiO_2$, is deposited on the block illustrated in FIG. 4 and then, conventionally and in a manner known per se, insulating lateral zones or spacers 12 are formed, these bearing both on the nitride sublayer 10 and on the internal side walls of the cavity 110 in the sacrificial layer 11. These spacers 12 are formed especially by whole-wafer resinless anisotropic etching.

Figure 5:
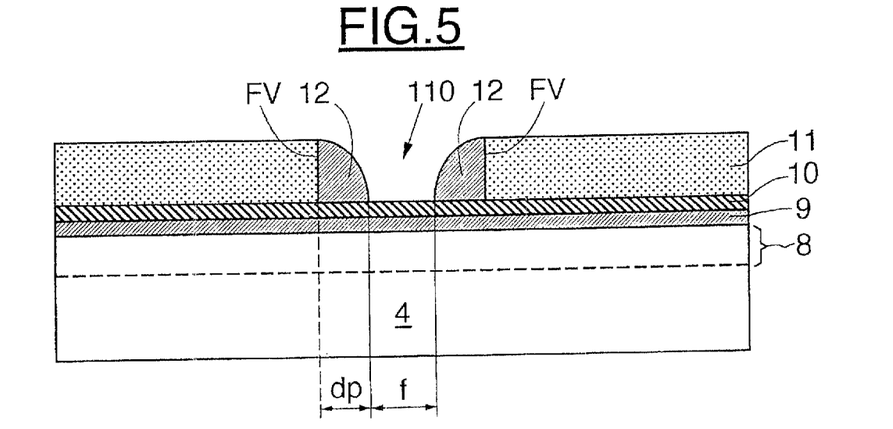

The separation f as shown in FIG. 5, between the spacers 12 defines the width of the emitter window.

As will be seen in greater detail below, the implantation of the extrinsic base will take place on either side of the vertical walls FV of the spacers, that is to say at a distance dp from the external boundaries of the emitter window. This distance dp is predetermined and specified so as to guarantee that there is no contact between the implanted extrinsic base zones, given their extension after diffusion, and the $n^{++}$-doped diffused zone lying beneath the emitter window in the base region, this $n^{+-}$ zone resulting from the doping of the emitter, as will be explained in greater detail below.

Of course, the distance dp also takes into account the tolerance limits due to the variations in the process.

Consequently, a person skilled in the art will know how to adjust the value of the dimension d of the cavity 110 as well as the thickness of conformal oxide allowing the spacers 12 to be produced, so as to obtain a desired value for the window f as well as the value specified for the distance dp.

By way of indication, a value of 0.6 microns may be chosen for the dimension d, this being compatible with the formation of spacers whose width at the bottom, dp, is about 0.15 microns, resulting in an emitter window having a width of 0.3 to 0.4 microns.

Figure 6:
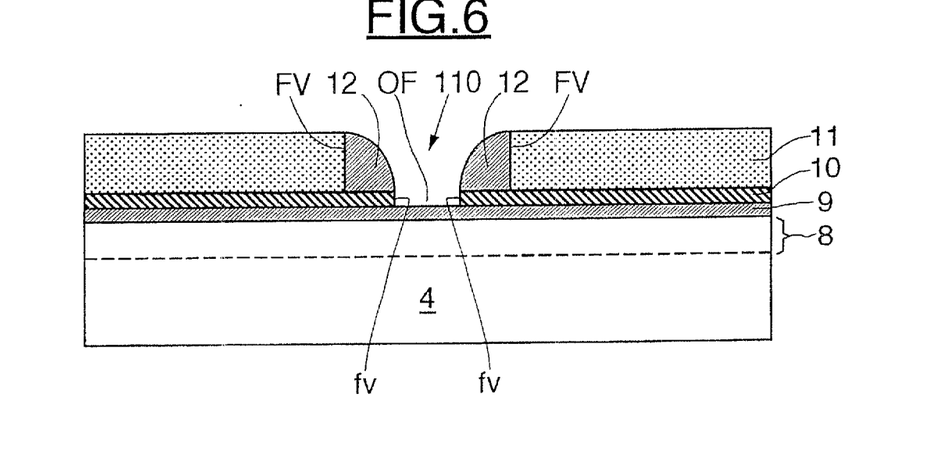

Next as shown in FIG. 6, that portion of the insulating nitride sublayer 10 which is located between the spacers 12 is conventionally etched, so as to etch an orifice OF. This etching is selective with respect to the oxide ($SiO_2$) forming the first insulating sublayer 9.

It should be noted here that no photolithography level was needed to define and etch the orifice OF, which corresponds to the emitter window. Consequently, the vertical walls fv (i.e., vertical lateral edges) of the orifice OF are self-aligned with respect to the vertical walls FV (i.e., vertical lateral walls) of the spacers.

Figure 7:
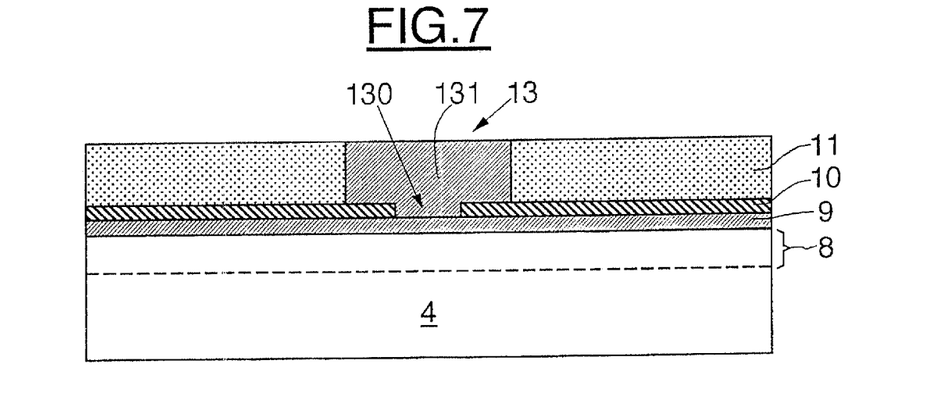

The following step consists in depositing, over the entire assembly illustrated in FIG. 6, a thick oxide so as to fill the etched orifice OF as well as the recess located between the spacers 12. This oxide is then planarized using conventional techniques known per se, for example chemical-mechanical polishing, so as to obtain, as illustrated in FIG. 7, an oxide block 13 having a narrower, lower part 130, which extends into the insulating sublayer 10, and a wider, upper part 131, which projects beyond the emitter window and rests on the base region 8 via the insulating stack 9, 10.

Figure 8:
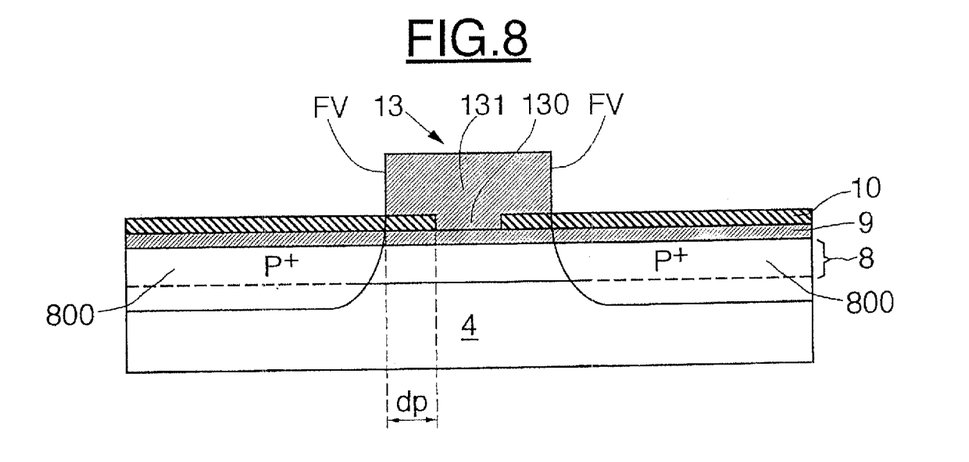

Next, the sacrificial layer 11 located on either side of the oxide block 13 is etched away. This etching is advantageously isotropic etching, exhibiting high selectivity with respect, on the one hand, to the silicon dioxide $SiO_2$ forming the oxide block 13 and, on the other hand, to the silicon nitride forming the second sublayer 10. This high selectivity and this great isotropy make it possible, as illustrated in FIG. 8, to obtain almost vertical walls FV for the oxide block 13. Such etching may be carried out using a plasma gas comprising a mixture of hydrobromic acid and oxygen, in a volume ratio of approximately 10 (ten times more hydrobromic acid than oxygen) at a pressure greater than 15 mTorr. A selectivity of approximately 200 with respect to silicon dioxide and approximately 10 with respect to silicon nitride is then obtained.

Next, $p^+$ implantation is carried out on either side of the oxide block 13 so as to form implanted extrinsic base zones 800.

Since only a single photolithography mask was needed to define the vertical walls FV and the emitter window, the extrinsic base implantation is consequently self-aligned with respect to the emitter window.

Consequently, it is not necessary to take into account any alignment tolerance on the photolithography masks for specifying the predetermined distance dp separating the boundaries of the emitter window from the boundaries of the implanted extrinsic base. Consequently, the tolerance on the distance dp may be corresponding reduced, namely by about 0.18 microns, which at the present time represents the minimum alignment tolerance for two photolithography masks.

Figure 9:
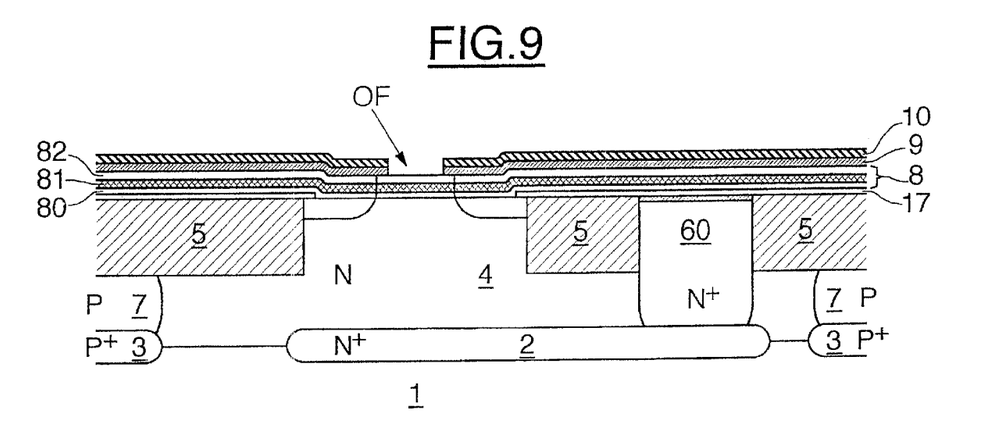

Next, the oxide block 13 and the subjacent portion of the insulating sublayer 9 are removed so as to obtain the configuration illustrated in FIG. 9, in which the structure obtained in its entirety, i.e. beyond the base window, has again been shown. The oxide block 13 may be removed conventionally, and in a manner known per se, by chemical etching in a bath of hydrofluoric acid.

In order to allow a chemically clean monocrystallinic silicon surface to be obtained, that is to say one whose concentration of oxygen atoms is less than $10^{15}$ cm$^2$, a chemical deoxidation treatment may also be carried out in the emitter window using a bath of hydrofluoric-based acid diluted to approximately 1% for one minute. Such a chemical deoxidation does not degrade the subjacent monocrystalline silicon surface and consequently does not introduce any crystal defects.

In order to further improve the surface state of the silicon in the emitter window, it is advantageous to carry out a desorption treatment in hydrogen at high temperature (greater than 550° C.) so as to remove residual impurities adsorbed on the surface of the silicon during the deoxidation.

Next, the emitter for the transistor is produced in an ultra-clean CVD deposition reactor, for example the one sold by Applied Materials under the reference CENTURA HTF.

More specifically, the semiconductor block with the exposed base is exposed, in the emitter window, to a gas mixture consisting of silane and arsine in a non-oxidizing atmosphere, typically under vacuum or in hydrogen.

The CVD deposition conditions are, for example, a flow rate of 10 litres of hydrogen per minute, a flow rate of 0.5 litres of silane per minute and a flow rate of 0.12 cm$^3$ of arsine per minute, at 630° C. and at a pressure of 80 torr.

A person skilled in the art will have noticed that these conditions correspond in fact to the deposition of polysilicon. However, because of the chemically clean nature of the monocrystalline surface of the base exposed in the emitter window, the silicon deposited in this reactor grows epitaxially, that is to say it grows as a monocrystalline layer on the base.

Figure 10:
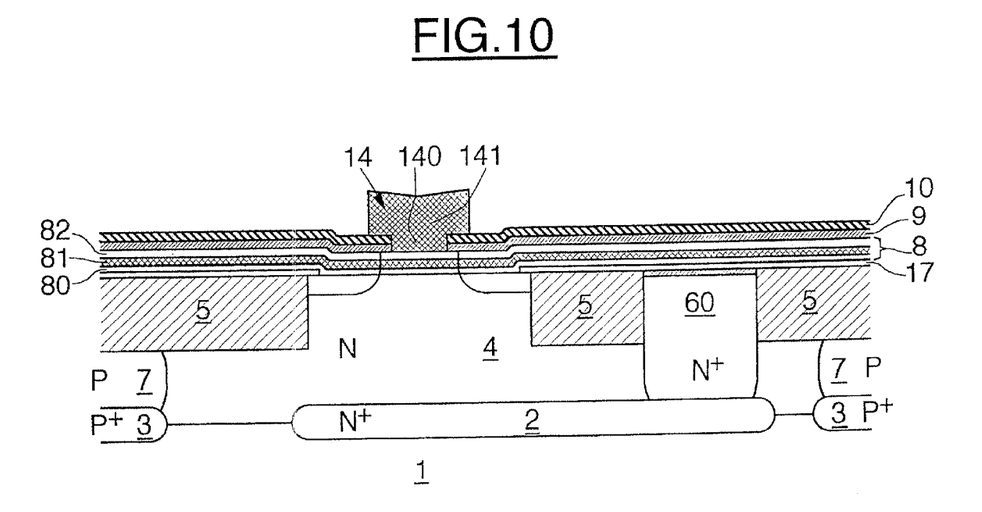

After having obtained a silicon layer with a thickness of the order of 2500 Å, the silicon layer is conventionally etched, using a new photolithography mask and a corresponding block of resin, so as to obtain an emitter 14 comprising, in the emitter window, a lower part 140 surmounted by an upper part 141 wider than the emitter window. This emitter has been deposited in situ and is monocrystalline, at least near the interface with the base in the emitter window as shown in FIG. 10.

In practice, it has been found that it was monocrystalline near the interface and polycrystalline above the nitride, and had a preferred orientation in the epitaxially grown upper part above the emitter window.

Figure 11:
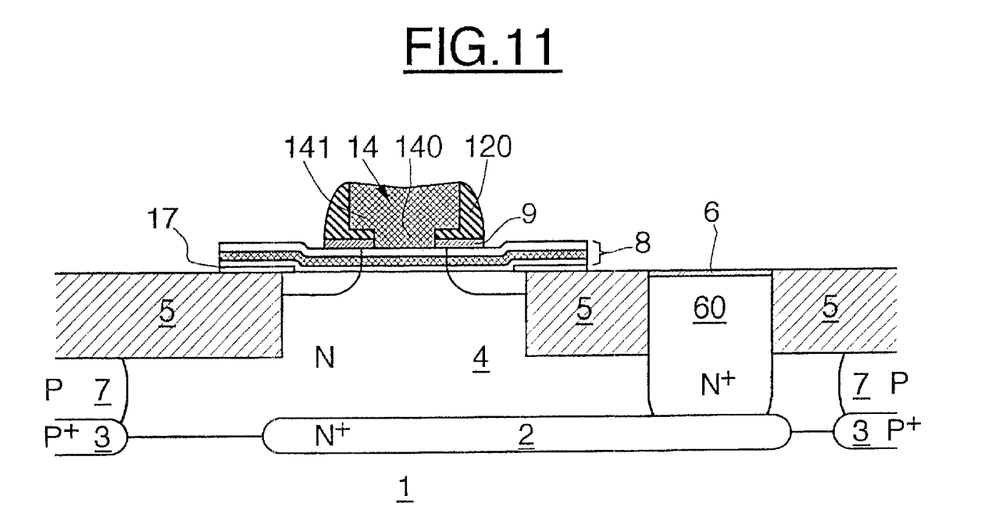

Next, a silicon nitride layer is deposited and etched so as to obtain spacers 120 which include the silicon nitride layer 10 and bear on the vertical walls of the upper region 141 of the emitter and on the silicon dioxide layer 9 as shown in FIG. 11.

With the aid of a new mask, the geometry of the base of the transistor is then defined and, after having pre-etched the oxide layer 9, the stack of layers 17 and 8 are etched so as to obtain the configuration illustrated in FIG. 11.

The final step consists in producing the base, emitter and collector connection areas S using a known technique of the "self-aligned silicide" type, which comprises depositing a layer of metal (for example titanium) in order to form a silicide, TiSi$_2$, on the silicon regions of the extrinsic base, the extrinsic emitter and the extrinsic collector.

Figure 12:
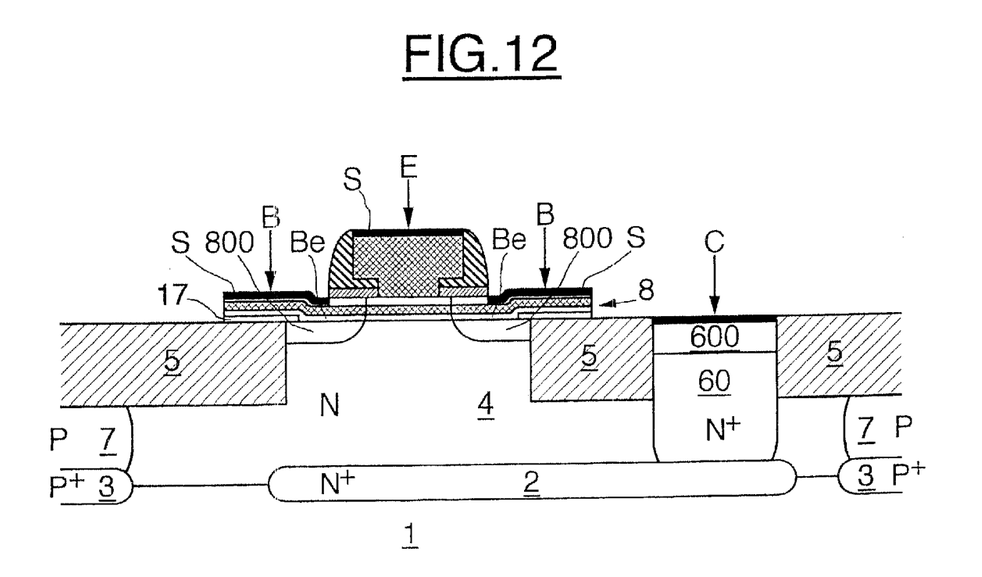

The transistor according to the invention, as illustrated in FIG. 12, is therefore an NPN vertical bipolar transistor with a silicon-germanium heterojunction, which can be used in a VLSI-type BiCMOS technology. The extrinsic zones are self-aligned with respect to the emitter window.

Moreover, in the method of implementation that has just been described, but which is not limiting, the transistor comprises a monocrystalline emitter directly in contact with the silicon of the upper encapsulation layer 82. However, especially because of the diffusion of the dopants and of the various conventional heat treatments, the emitter-base junction lies within the layer 82. The transistor has, because of the self-alignment of the extrinsic base with respect to the emitter window, a reduced base access resistance. The transistor also has a reduced low-frequency noise, while retaining good static parameters, especially current gain. Its maximum oscillation frequency is optimized and it furthermore has a reduced emitter resistance compared with transistors having a polycrystalline emitter.

Although the application of the invention to the above embodiments has been discussed with reference to the figures, the invention should not be construed as limited thereto. It will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for fabricating a bipolar transistor comprising the steps of:

producing a base region comprising an extrinsic base and an intrinsic base;

forming an insulating layer above the intrinsic base;

etching an orifice in the insulating layer, the orifice etched with dimensions corresponding to dimensions of an emitter window and the orifice etched with vertical lateral edges;

producing an emitter formed from an oxide block on the insulating layer formed above the intrinsic base, so that the oxide block comprises a narrower lower part extending into the orifice etched in the insulating layer, the oxide block comprises a wider upper part resting on the insulating layer, the wider upper part of the oxide block having vertical lateral walls, so that the vertical lateral edges of the orifice in the insulating layer is self-aligned with the vertical lateral walls of the wider upper part; and implanting dopants in the extrinsic base before the emitter is formed and after the production of the emitter window, so that dopants are implanted on either side of and at a predetermined distance from the vertical lateral boundaries of the emitter window, so that the extrinsic base is self-aligned with respect to the emitter window.

2. The process according to claim 1, wherein the step of producing an oxide block further comprises the sub-steps of:

forming a sacrificial layer above the insulating layer;

etching a cavity in the sacrificial layer by photolithography, the cavity whose dimensions correspond to dimensions of the wider upper part of the oxide block;

forming a set of spacers resting on the insulating layer of the vertical lateral walls, by oxide deposition followed by whole-wafer resinless anisotropic etching, the set of spacers at a separation distance therebetween which defines the dimension of width for the emitter window;

partial etching of the insulating layer between the set of spacers so as to form the orifice;

filling, with oxide, the orifice and a space defined between the set of spacers; and removing of the sacrificial layer so that the oxide block is left on the insulating layer.

3. The process according to claim 2, wherein the step forming the insulating layer further comprises the sub-steps of:

forming a first sub-layer from a first dielectric; and forming a second sub-layer from a second sub-layer from a second dielectric;

wherein the set of spacers and the oxide block are formed from the first silicon oxide;

wherein the etching of the cavity in the sacrificial layer and the etching of the spacers are carried out so as to stop on the second insulating sub-layer; and wherein in that the orifice whose dimensions correspond to those of the emitter window, is etched in the second insulating sub-layer.

4. The process according to claim 3, wherein the step of forming the sacrificial layer includes forming the sacrificial layer from polysilicon.

5. The process according to claim 3, wherein the step of forming the sacrificial layer includes forming the sacrificial layer from silicon-germanium.

6. The process according to claim 5, wherein the step of removing the sacrificial layer comprises removing the sacrificial layer using isotropic plasma etching with a gas mixture consisting of hydrobromic acid and oxygen in a volume ratio of the order of 10, and a pressure greater than 15 mTorr.

7. The process according to claim 6, wherein the step of removing the sacrificial layer comprises removing the sacrificial layer using isotropic plasma etching with a gas mixture consisting of hydrobromic acid and oxygen in a volume ratio of the order of 10, and a pressure greater than 15 mTorr.

8. The process according to claim 1, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

9. The process according to claim 1, wherein the step of producing the base region includes producing the base region with a SiGe heterojunction and the base region comprises epitaxial growth of a stack of silicon and silicon-germanium layers.

10. The process according to claim 1, wherein the step of producing the emitter region includes producing the emitter region with epitaxial growth, on the emitter window, of the upper surface of the base stack so as to obtain, at least above the window, an emitter region formed from monocrystalline silicon and directly in contact with the upper layer of the stack.

11. The process according to claims 2, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

12. The process according to claims 3, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

13. The process according to claims 4, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

14. The process according to claims 5, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

15. The process according to claims 6, wherein the step of producing an emitter further comprises the sub-steps of:

etching of the oxide block and part of the insulating layer which is located in the emitter window;

forming a polysilicon layer on the unetched areas of the insulating layer and on part of the intrinsic base which is located in the emitter window; and etching of the polysilicon layer so as to form the emitter block.

16. The process according to claim 2, wherein the step of producing the base region includes producing the base region with a SiGe heterojunction and the base region comprises epitaxial growth of a stack of silicon and silicon-germanium layers.

17. The process according to claim 3, wherein the step of producing the base region includes producing the base region with a SiGe heterojunction and the base region comprises epitaxial growth of a stack of silicon and silicon-germanium layers.

18. The process according to claim 4, wherein the step of producing the base region includes producing the base region with a SiGe heterojunction and the base region comprises epitaxial growth of a stack of silicon and silicon-germanium layers.

19. The process according to claim 5, wherein the step of producing the base region includes producing the base region with a SiGe heterojunction and the base region comprises epitaxial growth of a stack of silicon and silicon-germanium layers.

20. The process according to claim 6, wherein the step of producing the base region includes producing twe base region with a SiGe heterojunction and the base region comprises epitaxial growth of a stack of silicon and silicon-germanium layers.

21. The process according to claim 15, wherein the step of producing the base region includes producing the base region with a SiGe heterojunction and the base region comprises epitaxial growth of a stack of silicon and silicon-germanium layers.

22. A process for fabricating a bipolar transistor comprising:

producing a base region comprising an extrinsic base and an intrinsic base;

forming an insulating layer above the intrinsic base;

etching an orifice in the insulating layer, the orifice etched with dimensions corresponding to dimensions of an emitter window and the orifice etched with vertical lateral edges;

producing an emitter formed from an oxide block on the insulating layer formed above the intrinsic base, so that the oxide block comprises a narrower lower part extending into the orifice etched in the insulating layer, the oxide block comprises a wider upper part resting on the insulating layer, the wider upper part of the oxide block having vertical lateral walls, so that the vertical lateral edges of the orifice in the insulating layer is self-aligned with the vertical lateral walls of the wider upper part; and implanting dopants in the extrinsic base before the emitter is formed and after the production of the emitter window;

wherein the dopants are implanted on either side of and at a predetermined distance from any vertical lateral boundary of the emitter window, so that the extrinsic base is self-aligned with respect to the emitter window.

* * * * *